US007173492B2

(12) United States Patent
Takahashi et al.

(10) Patent No.: US 7,173,492 B2
(45) Date of Patent: Feb. 6, 2007

(54) HIGH FREQUENCY POWER AMPLIFICATION ELECTRIC PART AND WIRELESS COMMUNICATION SYSTEM

(75) Inventors: Kyoichi Takahashi, Fujioka (JP); Nobuhiro Matsudaira, Chigasaki (JP); Hitoshi Akamine, Maebashi (JP)

(73) Assignees: Renesas Technology Corp., Tokyo (JP); Hitachi ULSI Systems. Co., Ltd., Tokyo (JP); Hitachi Hybrid Network Co., Ltd., Yokohama (JP)

( * ) Notice: Subject to any disclaimer, the term of this patent is extended or adjusted under 35 U.S.C. 154(b) by 0 days.

(21) Appl. No.: 11/231,819

(22) Filed: Sep. 22, 2005

(65) Prior Publication Data

US 2006/0012435 A1    Jan. 19, 2006

Related U.S. Application Data

(63) Continuation of application No. 10/682,249, filed on Oct. 10, 2003, now Pat. No. 6,972,626.

(30) Foreign Application Priority Data

Oct. 16, 2002 (JP) ............................. 2002-302021

(51) Int. Cl.
    *H03G 3/30* (2006.01)
(52) U.S. Cl. ..................... 330/285; 330/129; 330/279
(58) Field of Classification Search .................. None
    See application file for complete search history.

(56) References Cited

U.S. PATENT DOCUMENTS 5,029,298 A * 7/1991 Chiba et al. ............... 330/285

5,497,125 A    3/1996 Royds ...................... 330/136

(Continued)

FOREIGN PATENT DOCUMENTS

EP        0896439        2/1999

(Continued)

OTHER PUBLICATIONS

"Basis of Microwave and Its Application", Sogo Electrics Press, Jun. 10, 1995, pp. 185-198.
"Electronic Material", Institute for Industrial Research, Apr. 1999, pp. 91-95.

*Primary Examiner*—Khanh Van Nguyen
(74) *Attorney, Agent, or Firm*—Mattingly, Stanger, Malur & Brundidge, P.C.

(57) ABSTRACT

The present invention provides a high frequency amplifier suitable for use in a wireless communication system which performs detection of an output level necessary for feedback control by a current detection system, wherein control sensitivity in an area low in transmit request level is lowered so that an output level can be controlled over the whole control range with satisfactory accuracy. There is provided a high frequency power amplification electric part constituting a wireless communication system, which performs detection of an output level necessary for feedback control of output power by a current detection system, compares the output level detected signal and an output level designation signal and generates a bias voltage for a high frequency power amplifier according to the difference therebetween to thereby control gain, wherein an nth root converter or a logarithm converter is provided between a current detector and a current-voltage converter.

6 Claims, 7 Drawing Sheets

U.S. PATENT DOCUMENTS

| | | | |
|---|---|---|---|
| 6,154,664 A | 11/2000 | Chorey et al. | 330/290 |
| 6,172,567 B1 | 1/2001 | Ueno et al. | 455/571 |
| 6,492,872 B1 | 12/2002 | Fujioka et al. | 330/285 |
| 6,605,999 B2 | 8/2003 | Matsushita et al. | 330/285 |

FOREIGN PATENT DOCUMENTS

| | | |
|---|---|---|
| JP | 4-144305 | 5/1992 |
| JP | 2000-523757 | 10/1999 |
| JP | 2000-151310 | 5/2000 |

* cited by examiner

HIGH FREQUENCY POWER AMPLIFICATION ELECTRIC PART AND WIRELESS COMMUNICATION SYSTEM

This is a continuation application of U.S. Ser. No. 10/682,249, filed Oct. 10, 2003 now U.S. Pat. No. 6,972,626.

BACKGROUND OF THE INVENTION

The present invention relates to a high frequency power amplifier which is used in a wireless communication system such as a cellular phone and which amplifies a high frequency signal and outputs the so-amplified signal therefrom, and a technology effective if applied to an electric part in which the high frequency power amplifier is built. The present invention relates particularly to a technology for improving control sensitivity in an area of level low in output power in a wireless communication system having a detection circuit which performs detection of an output level necessary for feedback control of output power by a current detection system.

A high frequency power amplifier for amplifying a post-modulation signal has generally been built in a transmitting-side output unit in a wireless communication equipment (mobile communication apparatus) such as a cellular phone. In the conventional wireless communication equipment, the level outputted from the high frequency power amplifier or an antenna has been detected and fed back to control an amplification factor of the high frequency power amplifier according to a transmit request level sent from a control circuit such as a baseband circuit or a microprocessor (see Patent Document 1, for example). In general, the detection of the output level has heretofore been performed using a coupler or a detector circuit or the like. The detector circuit is often configured as a semiconductor integrated circuit separated from the high frequency power amplifier.

Also the coupler is a device for detecting an output level via a capacitor formed between the device and a conductor disposed in parallel with an output line (microstrip line) formed in a discrete part or an insulating substrate (module substrate). The device is larger in size than a device formed on a semiconductor chip. Incidentally, the directional coupler (coupler) has been described in, for example, "Basis of Microwave and Its Application" published by Sogo Electrics Press on Jun. 10, 1995, P185–P198. A ceramic-laminated low-pass filter and a directional coupler for mobile communications have been described in "Electronic Material" published by Institute for Industrial Research in the April issue in 1999, P91–P95.

Since semiconductor integrated circuits different from the high frequency power amplifier, and electric parts are used in large numbers in the conventional output level detection system of high frequency power amplifier, it becomes difficult to bring a module into less size. Further, when the coupler is used, a reference voltage might be applied to one end of the coupler in order to improve detection sensitivity. In such a case, a problem arises in that since there is a need to optimally set the reference voltage and make adjustments to voltages or the like corresponding to variations in part, the burden on a set maker increases. Also a problem arises in that when the coupler is used, power dissipation also develops.

Further, as a recent cellular phone, a dualband type cellular phone has been proposed which is capable of handling a signal based on a system like a DCS (Digital Cellular System) using frequencies lying in, for example, a 1710 MHz to 1785 MHz band in addition to a system called GSM (Global System for Mobile Communication) using frequencies lying in a 880 MHz to 915 MHz band. Since output power amplifiers are also provided corresponding to respective bands in a high frequency power amplification module used in such a cellular phone, there is also a need to provide couplers for detecting their output levels according to the respective bands. Therefore, a size reduction in module becomes more difficult.

Thus, the present applicant has made and filed the invention about a current detection type wireless communication system which is provided with an output detecting transistor that receives therein an input signal of a power amplifying transistor for amplifying a high frequency signal and causes a current proportional to the current flowing through the power amplifying transistor to flow, and a current mirror circuit for transferring the current of the output detecting transistor are provided, and which converts the current for a transfer destination of the current mirror circuit into its corresponding voltage and sets it as a detected signal of an output level, and compares the detected output level and a transmit request level to thereby control an output level (see Japanese Unexamined Patent Application No. 2000-523757).

[Patent Document 1]

Japanese Unexamined Patent Publication No. Hei 2000-151310

SUMMARY OF THE INVENTION

FIG. 9 shows a schematic configuration of a feedback control system of a high frequency power amplifier based on a current detection type output level detector, which is employed in a current detection type wireless communication system developed by the present applicant. In FIG. 9, reference numeral 10 indicates a power amplifier which amplifies a high frequency signal Pin, reference numeral 20 indicates a current detector which detects an output level of the power amplifier 10 and outputs a current corresponding to it, reference numeral 40 indicates a current-voltage converter which converts the output current from the current detector into its corresponding voltage, and reference numeral 50 indicates an error amplifier which compares the output voltage of the current-voltage converter and an output level designation signal Vramp supplied from a baseband circuit or a control circuit such as a microprocessor. The error amplifier generates a bias voltage corresponding to the difference between the input potentials and supplies it to the power amplifier 10, where the gain of the power amplifier 10 is controlled to control an output level.

The present inventors have discussed the relationship between the output level designation signal Vramp and the output power Pout obtained in the current detection type high frequency power amplifier shown in FIG. 9. As a result, such a relationship as indicated by a broken line A2 was shown in FIG. 4. It became apparent that control sensitivity in an area low in transmit request level was high and the output power Pout greatly changed with a slight change in transmit request level. The present invention has been made in view of problems associated with the above current detection type high frequency power amplifier. The present invention aims to cause a current detector to have such characteristics that its output changes on an nth root basis or logarithmic function basis with respect to the input to thereby solve the above problems.

Incidentally, there has been proposed the invention wherein in a coupler type communication system in which an output level of a high frequency power amplifier is detected by a detector circuit and then fed back, a detection circuit for square-detecting the output of the high frequency power amplifier by use of diodes in which current-voltage characteristics are given as logarithmic functions, and a circuit for log-transforming the output of the detection circuit are provided to carry out linear control (see Japanese Unexamined Patent Publication No. Hei 4(1992)-144305). However, the invention of the present prior application relates to the coupler type communication system and is not the invention directly related to the invention of the present application which has been made by finding out the above-mentioned problems associated with the current detection type communication system.

Described more specifically, the target to be detected is intended for output power and the output of the detector changes on an exponential function basis with respect to the output power in the case of the invention of the prior application wherein information necessary for feedback control is obtained using the detector circuit including the coupler (see FIG. 4(B) in the publication). On the other hand, the target to be detected is intended for current and the output current of the detector changes linearly with respect to the current in the case of the invention of the present application wherein the current detection type feedback control is carry out. Namely, the invention of the present application is the invention which intends to control a power amplifier in such a manner that desired output power is obtained based on the output of the detector, indicative of the characteristic completely different from one in the invention of the prior application. From this point of view, the two inventions are different from each other in starting point. It can be said that the invention of the prior application is the invention having no potential to reach the known art upon determining the non-obviousness of the invention of the present application.

Also the invention of the prior application using the diodes takes no consideration of detection errors due to the temperature characteristics of the diodes. In contrast to it, the invention of the present application is the invention that takes into consideration the detection errors referred to above and shows a technology extremely high in practicability, which discloses even measures for avoiding an error due to a change in temperature.

An object of the present invention is to provide a high frequency power amplification electric part suitable for use in a wireless communication system in which the detection of an output level necessary for feedback control of output power is carried out by a current detection system, wherein control sensitivity in an area low in transmit request level is lowered to thereby make it possible to control an output level over the whole control range with satisfactory accuracy, and a wireless communication system using the same.

Further, another object of the present invention is to provide a high-reliable high frequency power amplification electric part suitable for use in a wireless communication system in which the detection of an output level necessary for feedback control of output power is carried out by a current detection system, wherein even if the temperature changes, control sensitivity remains unchanged, and a wireless communication using the same.

The above, other objects and novel features of the present invention will become apparent from the description of the present Specification and the accompanying drawings.

A summary of a representative one of the inventions disclosed in the present application will be explained as follows:

In a high frequency power amplification electric part constituting a wireless communication system wherein the detection of an output level necessary for feedback control of output power is carried out by a current detection system, the output level detected signal and an output level designation signal are compared, and a bias voltage for a high frequency power amplifier is generated according to the difference therebetween to thereby perform gain control, an nth root converter or a logarithm converter is provided between a current detector and a current-voltage converter.

According to the above means, even if the degree of a change in output power with respect to the output level designation signal is large in an area low in transmit request level, the degree of a change in detected current or voltage of an output level detector with respect to the output level increases in an area low in the level of the output power. Therefore, the degree of a change in the output of an amplifier for generating a bias voltage corresponding to the difference between the output level detected signal and the output level designation signal becomes small in the area low in output level. Thus, the control sensitivity of the high frequency power amplifier with respect to the output level designation signal in the area low in the transmit request level is reduced so that the output level can be controlled over the whole control range with satisfactory accuracy.

DETAILED DESCRIPTION OF THE PREFERRED EMBODIMENTS

Preferred embodiments of the present invention will hereinafter be described based on the accompanying drawings.

Figure 1:
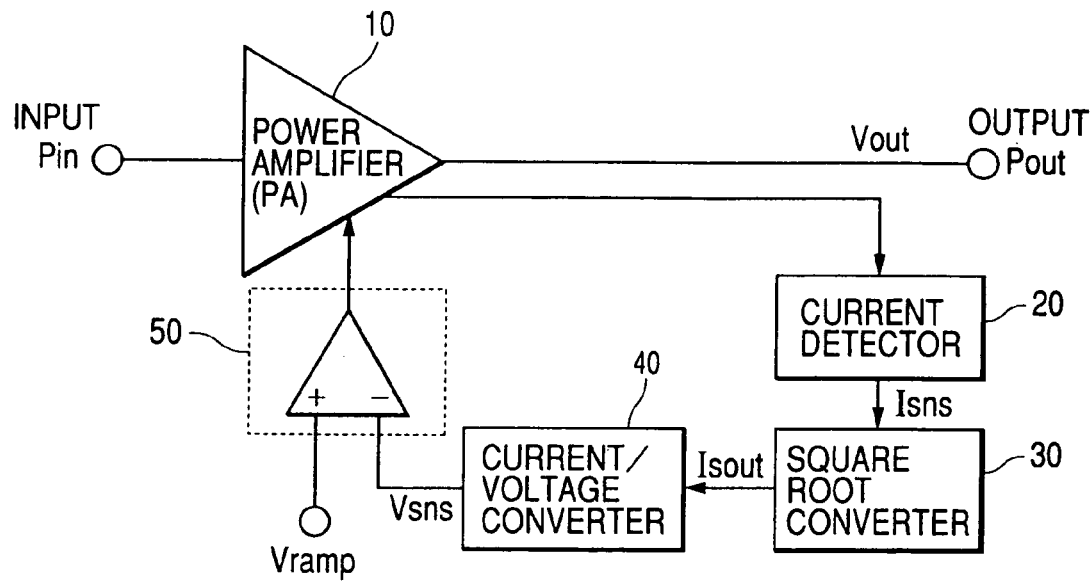
FIG. 1 is a block diagram showing a schematic configuration of a first embodiment of a feedback control system of a high frequency power amplifier employed in a current detection type wireless communication system to which the present invention is applied.

FIG. 1 shows a schematic configuration of a first embodiment of a feedback control system of a high frequency power amplifier based on a current detection type output level detecting circuit employed in a current detection type wireless communication system to which the present invention is applied.

Referring to FIG. 1, reference numeral 10 indicates a power amplifier which amplifies a high frequency signal Pin, reference numeral 20 indicates a current detector which detects an output level of the power amplifier 10 and outputs a current corresponding to it, reference numeral 30 indicates a square root converter which converts the current Isns outputted from the current detector 20 into a current Isout obtained by taking or extracting the square root of the Isns, reference numeral 40 indicates a current-voltage converter which converts the output current Isout from the square root converter 30 into a detected or sensed voltage Vsns, and reference numeral 50 indicates an error voltage detector (error amplifier) which compares the output voltage of the current-voltage converter 40 with an output level designation signal Vramp supplied from a control circuit such as an unillustrated baseband circuit or microprocessor or the like and outputs a voltage corresponding to the difference in potential between those. The output voltage of the error amplifier 50 is supplied to the power amplifier 10 as a bias voltage.

Figure 2:
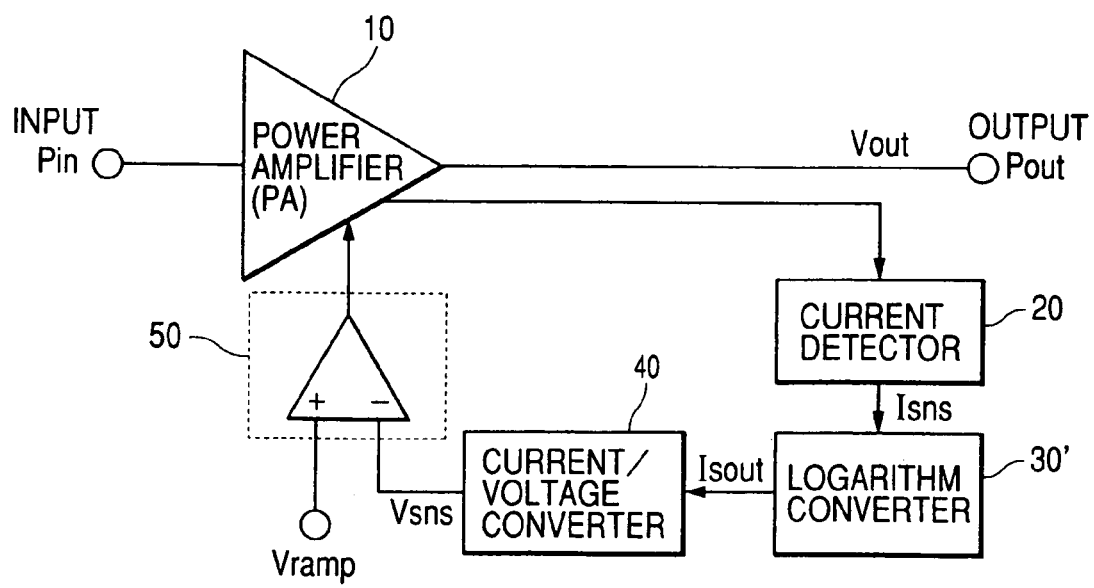
FIG. 2 is a block diagram illustrating a schematic configuration of a second embodiment of a feedback control system of a high frequency power amplifier employed in a current detection type wireless communication system to which the present invention is applied.

FIG. 2 shows a schematic configuration of a second embodiment of a feedback control system of a high frequency power amplifier employed in a current detection type wireless communication system to which the present invention is applied. The present embodiment is different from the embodiment shown in FIG. 1 in that a logarithm converter 30' which converts a current Isns outputted from a current detector 20 into a current Isout' obtained by extracting the logarithm of the current Isns and outputs it therefrom, is provided instead of the square root converter 30 which converts the current Isns outputted from the current detector 20 into the current Isout obtained by extracting the square root of the current Isns.

Although not shown in FIGS. 1 and 2, the power amplifiers 10 are respectively configured in such a manner that a transistor like a MOSFET (insulated gate field effect transistor) is connected in one or plural stages, the bias voltages outputted from the error amplifiers 50 are directly applied to their control terminals (gate terminals or base terminals) or voltages each obtained by dividing the bias voltage by a suitable resistance ratio are applied thereto, thereby to control the gains of the power amplifiers 10 so as to control the output levels.

Figure 3:
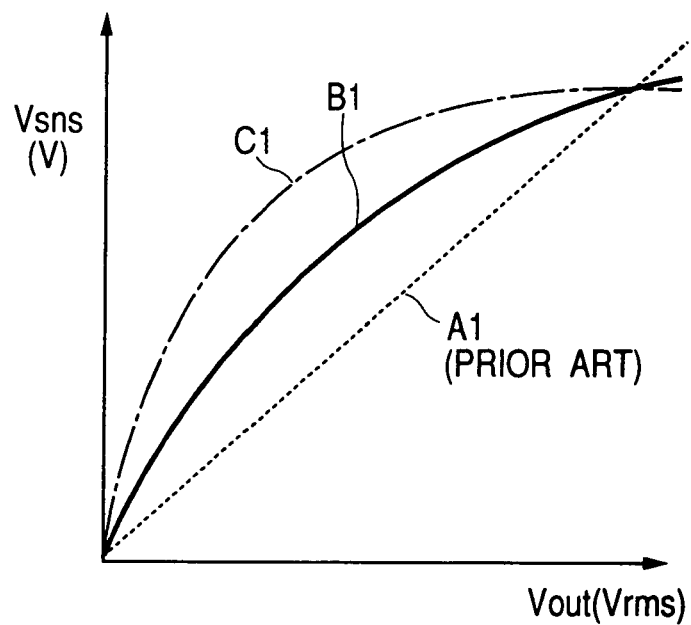
FIG. 3 is a graph depicting the relationship between an output voltage Vout and a detected voltage Vsns obtained in each of the feedback control systems of the high frequency power amplifiers according to the embodiments of the present invention and the prior application.

The relationship between the output voltage Vout obtained in the control system of the first embodiment and the output voltage (detected voltage) Vsns of the current-voltage converter 40 is shown in FIG. 3 by a solid line B1. The relationship between the output level designation signal Vramp and output power Pout obtained in the control system of the first embodiment is shown in FIG. 4 by a solid line B2.

Figure 4:
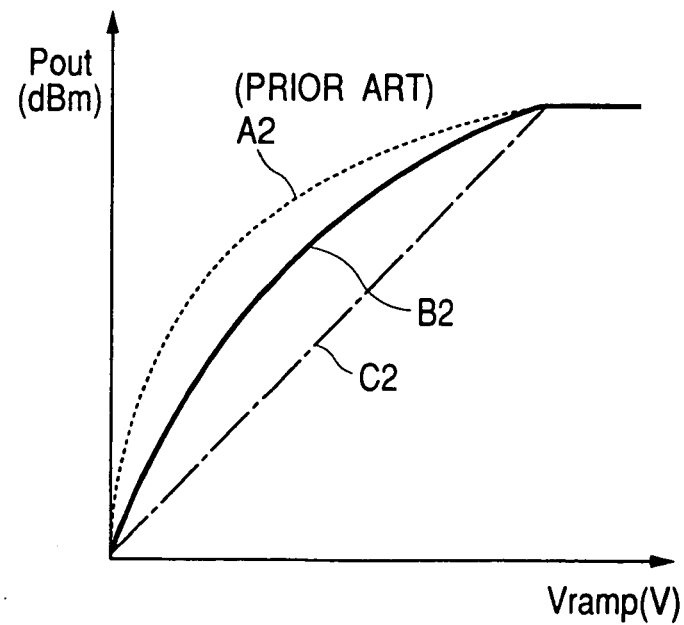
FIG. 4 is a graph showing the relationship between an output level designation signal Vramp and output power Pout obtained in each of the feedback control systems of the high frequency power amplifiers according to the embodiments of the present invention and the prior application.

Those indicated by alternate long and short dash lines C1 and C2 in FIGS. 3 and 4 respectively correspond to the relationship between the output voltage Vout obtained in the control system of the second embodiment and the output voltage Vsns of the current-voltage converter 40, and the relationship between the output level designation signal Vramp and output power Pout obtained in the control system of the second embodiment.

Figure 9:
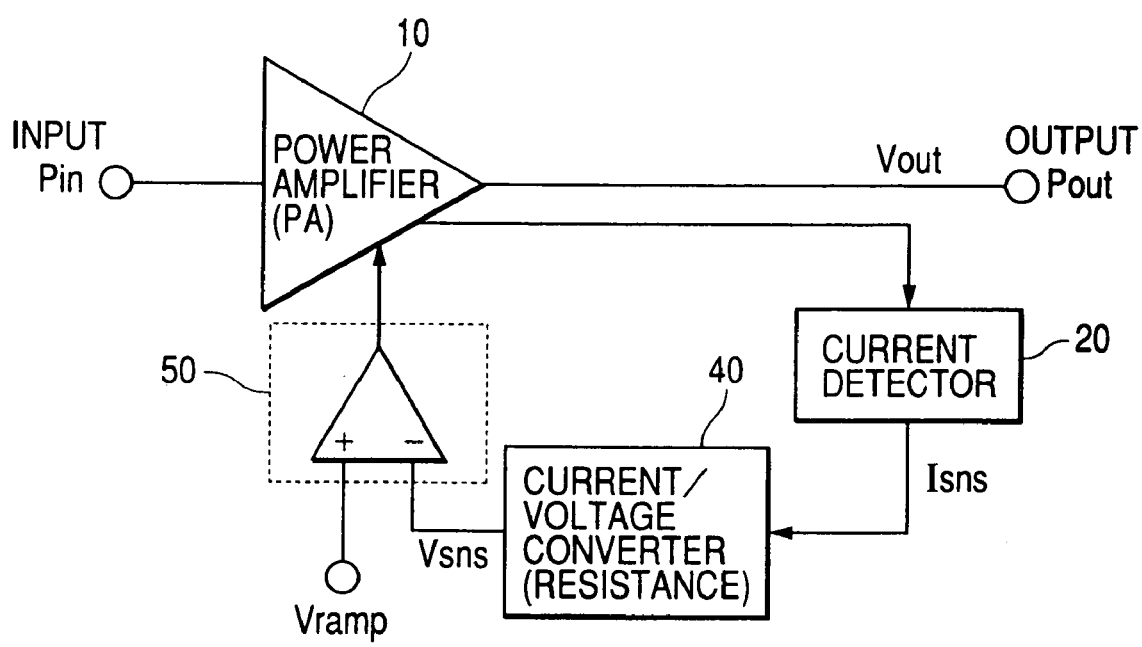
FIG. 9 is a block diagram showing a schematic configuration of a feedback control system of a high frequency power amplifier employed in a current detection type wireless communication system which has previously been developed by the present applicant.

Also those indicated by broken lines A1 and A2 in FIGS. 3 and 4 respectively correspond to the relationship between Vout and an output voltage Vsns of a current-voltage converter 40 in a control system shown in FIG. 9 unprovided with both the square root converter 30 employed in the first embodiment and the logarithm converter 30' employed in the second embodiment, and the relationship between an output level designation signal Vramp and output power Pout.

As is understood even from FIG. 3, owing to the provision of the nth root converter 30 or the logarithm converter 30', the degree of a change in the output voltage of the current-voltage converter 40 with respect to the output level Vout increases in an area in which the level of the output power Pout is low. Thus, it is understood from FIG. 4 that even if the degree of a change in the output power Pout with respect to the output level designation signal Vramp is large in an area in which a transmit or send request level is low, the control sensitivity of the high frequency power amplifier 10 with respect to the output level designation signal in the area low in transmit request level is reduced, so that the output level can be controlled with satisfactory accuracy over the whole control range.

Figure 5:
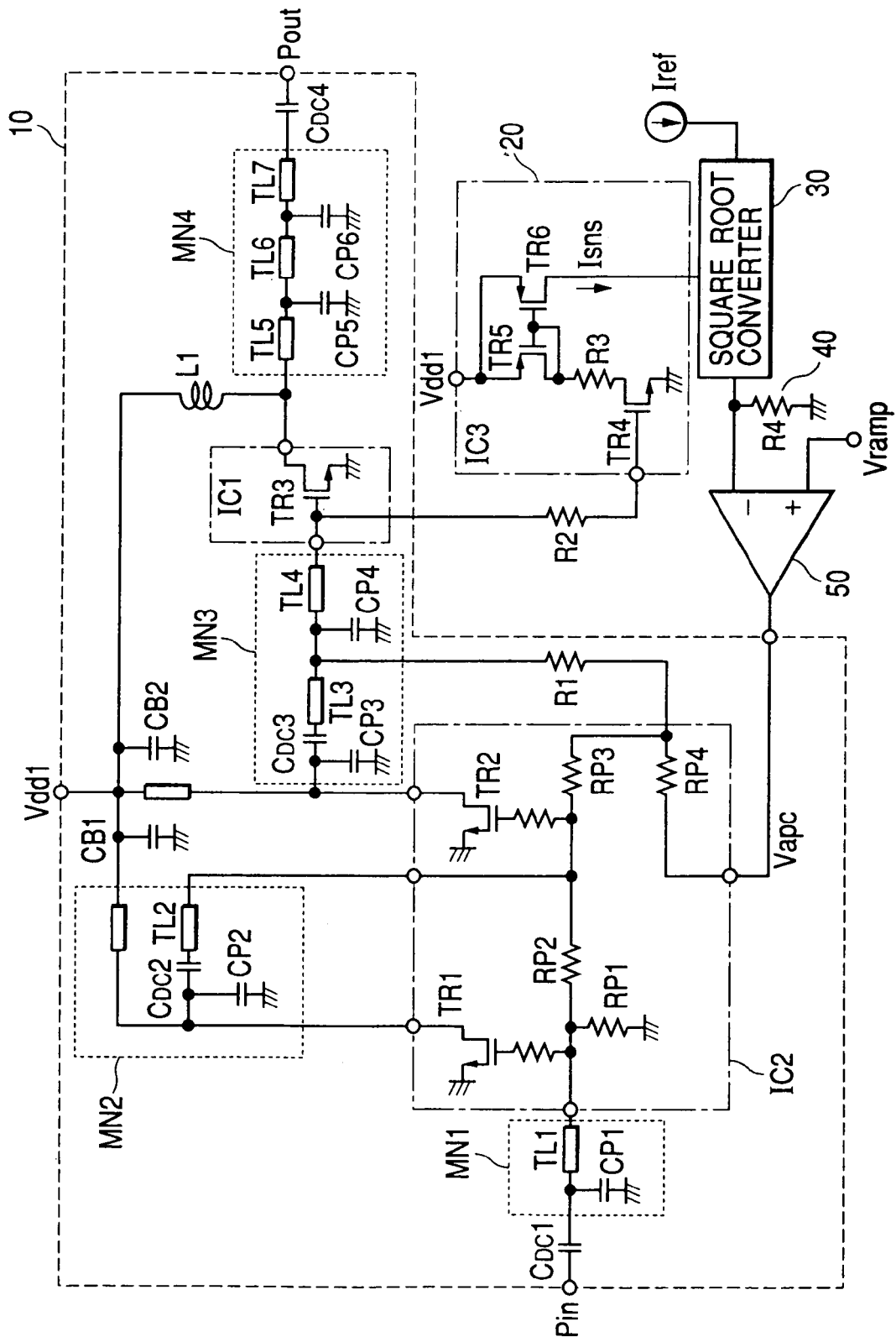
FIG. 5 is a circuit diagram depicting a more specific configuration of the embodiment shown in FIG. 1.

FIG. 5 shows a more specific configuration of the embodiment shown in FIG. 1. Referring to FIG. 5, reference numeral 10 denotes a high frequency amplifier which amplifies an input high frequency signal Pin and outputs the so-amplified signal therefrom. The high frequency amplifier 10 is made up of amplifying stages corresponding to three stages connected in tandem.

Referring to FIG. 5, TR1 indicates a power amplifying transistor which constitutes an amplifying stage corresponding to a first stage for amplifying the high frequency signal Pin, TR2 indicates a power amplifying transistor which constitutes an amplifying stage corresponding to a second stage, TR3 indicates a power amplifying transistor which constitutes an amplifying stage corresponding to a third stage, and L1 indicates an inductance element connected between a collector terminal of a final-stage transistor TR3 and a power supply voltage terminal Vdd. A λ/4 transmission line having an electrical length equivalent to one-quarter wavelength of the fundamental wave might be used instead of the inductance element L1. Although the power amplifying transistors TR1 through TR3 make use of MOSFETs in the present embodiment, other transistors such as a bipolar transistor, a GaAs MESFET, a heterojunction bipolar transistor (HBT), an HEMT (High Electron Mobility Transistor), etc. might be used.

The current detector 20 comprises an output detecting transistor TR4 having a gate terminal to which a signal identical to an input signal of the power amplifying transistor TR3 corresponding to the final amplifying stage of the high frequency amplifier 10 is applied via a resistor R2, a current mirror transistor TR5 series-connected to the transistor TR4 through a resistor R3, and a transistor TR6 current mirror-connected to the transistor TR5. By suitably setting the size ratio between the transistors TR3 and TR4, the current equivalent to 1/n of a collector current of the transistor TR3 flows through the transistor TR4. The current of the transistor TR4 is transferred to the transistor TR6 by a current mirror circuit, so that the drain current caused to flow through the transistor TR6 becomes a current Isns correlated with power outputted from the power amplifying transistor TR3.

The current Isns is converted by an nth root converter 30 or a logarithm converter 30'. The so-converted current Iout is caused to flow into a resistor R4 used as current-voltage converting means, so that the current is converted into a detected voltage Vsns corresponding to an output level. Then the detected voltage Vsns is supplied to an error amplifier 50 where it is compared with an output level designation signal Vramp supplied from a baseband circuit or the like. A voltage Vapc corresponding to the difference between Vsns and Vramp is outputted from the comparator 50. Voltages obtained by dividing the Vapc with resistors RP1 through RP4 are respectively applied to the gate terminals of the power amplifying transistors TR1 through TR3 of the respective stages as bias voltages, whereby the output level is controlled.

Incidentally, CDC1, CDC2 and CDC3 in FIG. 5 respectively indicate capacitive elements for cutting DC currents, and MN1 through MN4 respectively indicate impedance matching circuits comprising capacitors CP1 through CP6 and transmission lines TL1 through TL7. The size (gate width) of the output detecting transistor TR4 is set to the size equivalent to a few one-tenth of the size of the power amplifying transistor TR3. When the drain current Idd of the power amplifying transistor TR3 is a few A (Amperes), the drain current of the output detecting transistor TR4 is designed so as to reach a few 10 A. The size ratio between the current mirror transistors TR5 and TR6 is about 1:1. Thus, the current Isns outputted from a current detector 20 results in a value much smaller than a drain current Idd of the power amplifying transistor TR2.

Further, the present embodiment shows that circuits and elements, which are surrounded by alternate long and short dash lines added with symbols IC1, IC2 and IC3 in the circuit shown in FIG. 5, are respectively formed on discrete semiconductor chips. The circuit shown in FIG. 5 is made up of discrete parts such as these semiconductor chips IC1, IC2 and IC3, resistors, capacitors, etc. as a module. In the present Specification, one configured as if to be treatable as one electric part by packaging a plurality of semiconductor chips and discrete parts on an insulated board like a ceramic substrate in which printed wirings are made or given to its surface and provided thereinside and connecting individual parts by the printed wirings and bonding wires so as to assume the predetermined roles will be referred to as a module.

Figure 6:
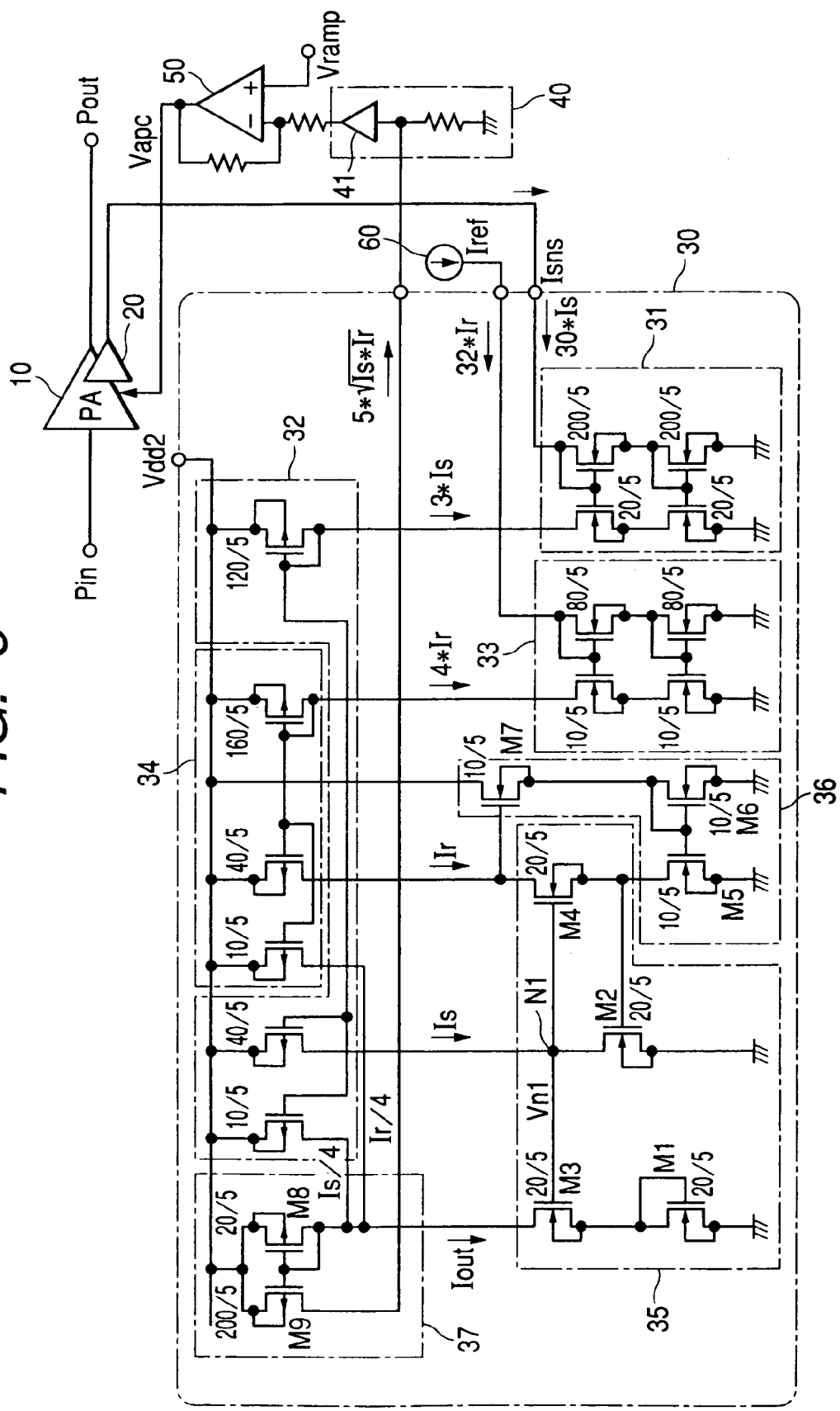
FIG. 6 is a circuit diagram illustrating a specific circuit example of an nth root converter.

FIG. 6 shows a square root circuit illustrated as one example of a specific circuit of the nth root converter 30.

The square root circuit according to the present embodiment comprises a first current mirror circuit 31 made up of N channel MOSFETs, which proportionally reduces or scales down the detected current Isns outputted from the current detector 20, a second current mirror circuit 32 made up of N channel MOSFETs, which further proportionally reduces a current for a transfer destination of the first current mirror circuit 31, a third current mirror circuit 33 made up of P channel MOSFETs, which proportionally reduces a reference current Iref outputted from a constant current source 60, a second current mirror circuit 34 made up of P channel MOSFETs, which further proportionally reduces a current for a transfer destination of the third current mirror circuit 33, an arithmetic circuit 35 which generates a current containing an item equivalent to the square root of the detected current Isns by use of the currents generated by these current mirror circuits, a bias circuit 36 which comprises a MOSFET M5 series-connected to a MOSFET M4 constituting the arithmetic circuit 35 and through which the same current as M4 is caused to flow, a MOSFET M6 current mirror-connected to M5, and a MOSFET M7 series-connected to M6, and which provides operating points of the MOSFETs M2 and M4 constituting the arithmetic circuit 35 by application of a drain voltage of M4 to the gate of the MOSFET M7, and a current combining circuit 37 which subtracts a current equivalent to each extra item other than the item of the square root from the current containing the item equivalent to the square root generated by the arithmetic circuit 35 using the currents generated by the current mirror circuits 32 and 34, and outputs a current proportional to the square root of the detected current Isns.

The respective current mirror circuits 31 through 34 respectively generate proportionally-reduced currents by setting the size ratios (ratios between gate widths) of the respective paired MOSFETs whose gates are respectively common-connected to one another, to predetermined values. Described specifically, the size ratios (ratios between the gate widths) of the respective paired MOSFETs are respectively set to the predetermined values so that the first current mirror circuit 31, the second current mirror circuit 32, the third current mirror circuit 33 and the fourth current mirror circuit 34 respectively generate the currents respectively reduced to $\frac{1}{10}$, $\frac{1}{3}$ and $\frac{1}{12}$, $\frac{1}{8}$, and $\frac{1}{4}$ and $\frac{1}{16}$.

Assuming that the current equivalent to $\frac{1}{30}$ of the detected current Isns inputted to the square root circuit 30 is set as Is and the current equivalent to $\frac{1}{32}$ of the reference current Iref outputted from the constant current source 60 is set as Ir, the currents drawn into the transfer destinations of the first current mirror circuit 31 and the third current mirror circuit 33 respectively result in 3Is and 4Ir. The currents drawn into the arithmetic circuit 35 from transfer destinations of the second current mirror circuit 32 and the fourth current mirror circuit 34 respectively result in Is and Ir.

The arithmetic circuit 35 comprises a MOSFET M2 which causes the current Is supplied from the second current mirror circuit 32 to flow between the source and drain thereof, a MOSFET M4 having a gate terminal to which a drain voltage of the MOSFET M2 is applied to cause the current Ir supplied from the fourth current mirror circuit 34 to flow between the drain and source thereof, a MOSFET M3 having a gate terminal to which the drain voltage of the MOSFET M2 is similarly applied to cause the current of a transfer source of the current combining circuit 37 to flow, and a MOSFET M1 connected to the source side of the MOSFET M3 in series with M3. The MOSFET M1 has a gate and drain coupled so as to serve as a diode. Further, the MOSFETs M1 through M4 are designed so that their sizes (gate widths W and gate lengths L) become identical to one another. They are fabricated simultaneously in the same process so as to have the same threshold voltage Vth. Moreover, the MOSFETs M1 through M4 are respectively set to the power supply voltage Vdd2 so as to operate in saturated regions.

Here, the gate-to-source voltages of the MOSFETs M1, M2, M3 and M4 are represented as VGS1, VGS2, VGS3 and VGS4, and the drain-to-source voltages thereof are represented as VDS1, VDS2, VDS3 and VDS4, respectively. When taking note of a node N1 of the arithmetic circuit 35, a potential Vn1 of the node N1 is determined based on Vn1=VGS1+VGS3 as viewed from the sides of the MOSFETs M1 and M3, and the potential Vn1 thereof is determined based on Vn1=VGS2+VGS4 as viewed from the sides of the MOSFETs M2 and M4. Since both potentials are equal to each other, they are represented as VGS1+VGS3=VGS2+VGS4.

Since the MOSFETs M1 and M3 are connected in series, the currents that flow therethrough are equal (Iout in the figure). Since the current Is is supplied from the current mirror circuit 32 to the MOSFET M2, and the current Ir is supplied from the current mirror circuit 34 to the MOSFET M4, the above equation can be represented like the following expression (1) by expressions indicative of drain current characteristics in the saturated regions of the MOSFETs.

$$2[Vth + \sqrt{\{(2/\beta)\cdot(L/W)/(1+\lambda\cdot VDS)\}}\cdot\sqrt{Iout}] = \quad (1)$$
$$Vth + \sqrt{\{(2/\beta)\cdot(L/W)/(1+\lambda\cdot VDS)\}}\cdot\sqrt{Is} +$$
$$Vth + \sqrt{\{(2/\beta)\cdot(L/W)/(1+\lambda\cdot VDS)\}}\cdot\sqrt{Ir}$$

In the above expression, the device sizes L/W of the respective MOSFETs M1 through M4 are equal to one another, and λ·VDS is negligibly small with respect to "1" from the device characteristic of each MOSFET. Therefore, the above expression can be arranged like the following expression:

$$\sqrt{Iout} = (\sqrt{Is} + \sqrt{Ir})/2 \quad (2)$$

Transforming this expression results in the following expression:

$$Iout = (Is+Ir)/4 + \sqrt{(Is\cdot Ir)}/2 \quad (3)$$

Although an extra item corresponding to (Is+Ir)/4 is contained, it is understood that the current Iout that flows through the MOSFET M3 is represented as the square root of the detected current Is.

Further, the current combining circuit 37 made up of current mirror MOSFETs M8 and M9 whose gates are common-connected to one another, is provided in the circuit according to the embodiment of FIG. 6. The present circuit is configured so as to output, as Iout, one obtained by adding the current of Is/4 supplied from the second current mirror circuit 32 and the current of Ir/4 supplied from the fourth current mirror circuit 34 to a current that flows through the MOSFET M8 corresponding to the current mirror's transfer source. Further, the size ratio between the MOSFETs M8 and M9 is designed so as to reach 1:10. Thus, a current having the magnitude equivalent to ten times the current reduced by (Is+Ir)/4 from Iout flows through the MOSFET M9 current mirror-connected to the MOSFET M8.

It is now understood that the current (Is+Ir)/4 added up by the current combining circuit 37 corresponds to a first item of the above expression (3). Accordingly, the current that flows through the MOSFET M9 results in ten times the second item of the above expression (3), i.e., $10\cdot\sqrt{(Is\cdot Ir)}/2 = 5\cdot\sqrt{(Is\cdot Ir)}$. In the circuit according to the embodiment shown in FIG. 6, the present current is outputted. Accordingly, the output current Is of the present circuit results in a current proportional to the square root of the Is.

On the other hand, as described above, the current Is results in 1/30 of the detected current Isns of the current detector 20. Thus, the output current in the circuit according to the embodiment of FIG. 6 results in a current proportional to the square root of the detected current Isns of the current detector 20. Then the current is caused to flow into a resistor Rs of a current-voltage converter 40, where it is converted into a voltage. The so-converted voltage is impedance-converted by a buffer 41, followed by being supplied to an error amplifier 50.

In the square root circuit employed in the present embodiment, no temperature coefficient is contained in the expression (3), and the output current does not depend on the temperature. Therefore, if the reference current Iref is constant, then operating characteristics are kept constant even if the ambient temperature changes, thus making it possible to provide conversion high in stability. As the constant current source whose current is constant even if the temperature changes, there is proposed a known constant current circuit wherein a device having a positive temperature characteristic and a device having a negative temperature characteristic are utilized in combination to thereby provide temperature compensating. Therefore, the reference current Iref fit to the square root circuit employed in the present embodiment can easily be generated and provided by utilizing such a temperature dependence-free constant current circuit.

Incidentally, while the first current mirror circuit 31 and the third current mirror circuit 33 respectively make use of a circuit in which the current mirror-connected MOSFET pairs are respectively vertically stacked in two stages in the embodiment of FIG. 6, this is done to reduce the dependence of the generated current on the power supply voltage. When a voltage high in stability is supplied as the operating voltage Vdd2 of the square root circuit 30, they can be configured as one-stage current mirror circuits similar to the current mirror circuits 32 and 34 on the P-MOS side respectively.

In the embodiment of FIG. 6, one obtained by adding the currents Is/4 and Ir/4 outputted from the current mirror circuits 32 and 34 to the current outputted from the MOSFET M8 of the current mirror circuit 37 is drawn into the arithmetic circuit 35 as the current Iout in order to eliminate the term of the extra current (Is+Ir)/4 other than the term of $\sqrt{(Is\cdot Ir)}$ from the output current. However, MOSFETs current mirror-connected to the MOSFETs constituting the current mirror circuits 31 and 32 to thereby supply proportionally-reduced currents are provided, and the current obtained by subtracting the currents Is/4 and Ir/4 from the current outputted from the MOSFET M9 in place of the addition of the currents Is/4 and Ir/4 to the current outputted from the MOSFET M8 may be set so as to flow through the sense resistor Rs.

Figure 7:
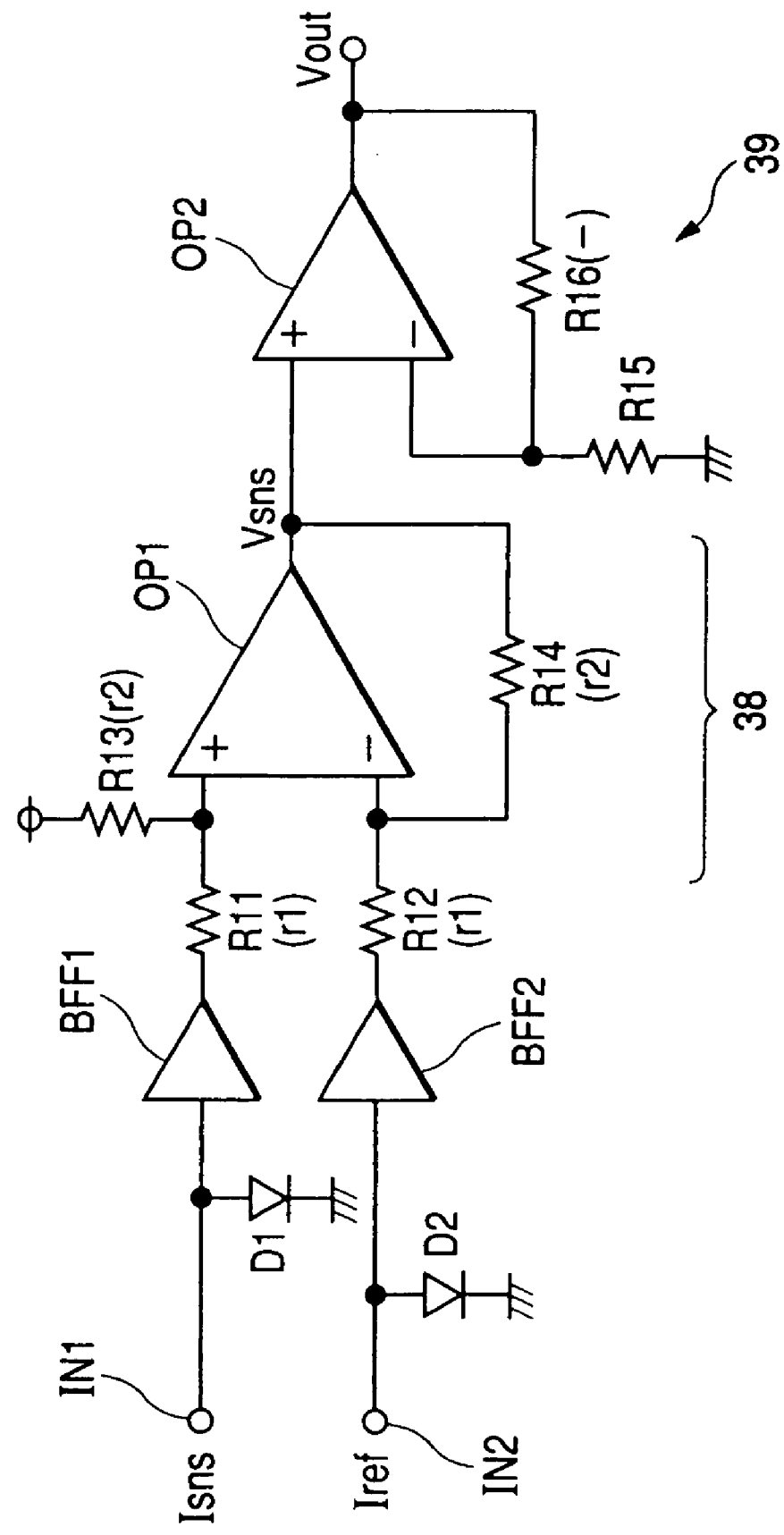
FIG. 7 is a circuit diagram showing a specific circuit example of a logarithm converter.

FIG. 7 shows a specific circuit example of a logarithm converter. Incidentally, although the logarithm converter employed in the present embodiment is not restricted in particular, it is configured as a circuit including the logarithm converter 30' and the next-stage current-voltage converter 40 shown in FIG. 2.

The logarithm converter according to the present embodiment is a circuit which performs logarithm conversion using current-voltage characteristics of diodes. The logarithm converter comprises: diodes D1 and D2 which are connected between a pair of input terminals IN1 and IN2 inputted with the detected current Isns outputted from the current detector 20 and the reference current Iref respectively, and their corresponding ground points, and which respectively convert the input currents into their corresponding voltages; buffers BFF1 and BFF2 which impedance-convert the converted voltages and transfer them to subsequent stages; an error amplifying circuit 38 which comprises input resistors R11 and R12, a differential amplifier OP1, a resistor R13 connected between a non-inversion input terminal of the amplifier OP1 and the ground point, and a feedback resistor R14 connected between an output terminal and an inversion input terminal of the amplifier OP1, and which amplifies the difference between the input potentials; and a temperature compensating voltage follower 39 comprising a differential amplifier OP2 which receives the output of the error amplifying circuit 38 at the non-inversion input terminal, a resistor R15 connected between an inversion input terminal of the amplifier OP2 and the ground point, and a feedback resistor R16 connected between an output terminal and the inversion input terminal of the amplifier OP2.

Assuming that the resistance values of the resistors R11 and R12 are set as r1, the resistance values of the resistors R13 and R14 are set as r2, and the temperature is set as T in the logarithm converter 30' shown in FIG. 7, the differential amplifier OP1 outputs such a voltage Vsns as expressed in the following equation (4):

$$Vsns=(kT/q)\cdot(r2/r1)\cdot\ln(Isns/Iref) \quad (4)$$

Incidentally, in the equation (4), k indicates Boltzmann's coefficient, and q indicates an amount of electrical charges of electrons. It is understood from this equation that the output Vsns of the differential amplifier OP1 is represented as a logarithm function. Since, however, the temperature T is contained in the equation, Vsns has temperature dependence. Thus, in the present embodiment, the temperature compensating voltage follower 39 is provided at stage subsequent to the differential amplifier OP1 to obtain an output subjected to temperature compensation.

Assuming that the resistance values of the resistors R15 and R16 are respectively set as r5 and r6 in the temperature compensating voltage follower 39, the differential amplifier OP2 outputs a voltage Vout expressed in the following equation (5):

$$Vout=(1+r6/r5)\cdot Vsns \quad (5)$$

Differentiating the above equation (4) at the temperature T obtains the following equation:

$$\partial Vsns/\partial T = Vsns/T$$

Differentiating the equation (5) at the temperature T obtains the following equation:

$$\partial Vout/\partial T=(1/r5)\cdot\partial r6/\partial T\cdot Vsns+(1+r6/r5)\cdot\partial Vsns/\partial T$$

Arranging this results in the following equation:

$$\partial Vout/\partial T=(r6/r5)(1/r6)\cdot\partial r6/\partial T\cdot Vsns+(1+r6/r5)\cdot Vsns/T$$

Since $(1/r6)\cdot\partial r6/\partial T$ indicates a temperature coefficient of the resistor R16 here, it is assumed to be $\alpha$. In doing so, the above equation is rewritten as follows:

$$\partial Vout/\partial T=\{(r6/r5)\cdot\alpha+(1+r6/r5)\cdot 1/T\}\cdot Vsns$$

In order to provide $\partial Vout/\partial T=0$, i.e., cause the output Vout of the differential amplifier OP2 so as not to have temperature dependence from this equation, $(r6/r5)\cdot\alpha+(1+r6/r5)\cdot 1/T=0$ may be obtained. That is, it is understood that $\alpha=-(1+r5/r6)\cdot 1/T$ may be obtained.

Assuming now that the temperature T is set as 360° K., and a resistor in which $\alpha$ is −3300 ppm/° C. is used, r6/r5=5.3 is obtained from $(1+r5/r6)\cdot 1/360=0.0033$. Thus, it is understood that, for example, a resistor whose resistance value r5 is 5.6 kΩ may be used as R15 and a resistor whose resistance value r6 is 30 kΩ may be used as R16. Since the resistor in which $\alpha$ is −3300 ppm/° C. is easily available if discrete parts may be used as the resistors R15 and R16, it is possible to realize the logarithm converter 30' which outputs a voltage Vout obtained by effecting logarithm conversion on a detected current Isns.

While the square root converter 30 shown in FIG. 6 is slightly slow in speed because it is made up of MOSFETs, the logarithm converter 30' according to the embodiment of FIG. 7 has an advantage in that it can be operated at a speed faster than the square root converter 30 if the buffers BFF1 and BFF2 are made up of bipolar transistors. On the other hand, when the square root converter 30 is constituted by the bipolar transistors, it is difficult to design it so as to have desired characteristics. However, if the MOSFETs are used, then the circuit having the desired characteristics can easily be realized by using such a configuration as shown in FIG. 6. On the other hand, when the current detector 20 and the error amplifier 50 are made up of MOSFETs, the square root converter 30 constituted of the MOSFETs can be formed on the same semiconductor chip as them, thus making it possible to reduce the number of parts.

Figure 8:
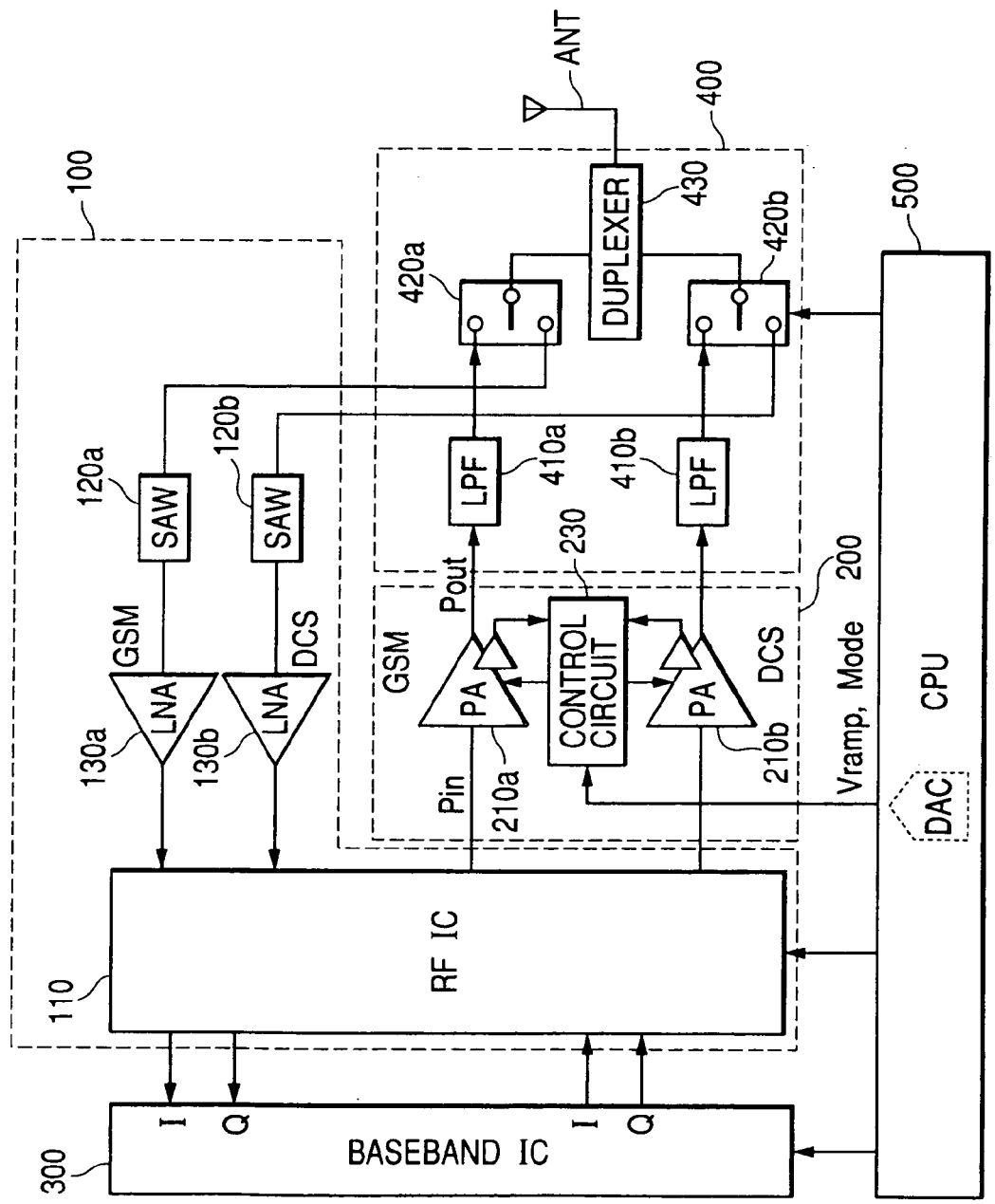
FIG. 8 is a block diagram depicting a schematic configuration of a system capable of performing wireless communications of two communication systems of GSM and DCS to which the present invention is applied.

FIG. 8 shows a schematic configuration of a system capable of performing wireless communications of two communication systems or modes of GSM and DCS as one example of a wireless communication system to which the present invention is applied.

In FIG. 8, reference numeral 100 indicates a high frequency module (hereinafter called RF module) wherein a high frequency signal processing circuit (high frequency IC) 110 brought into semiconductor integrated circuit form, having a modulator-demodulator capable of GMSK modulation and demodulation in the GSM and DCS systems, bandpass filters SAW constituted of elastic surface wave filters for removing unnecessary waves from a received signal, low noise amplifiers LNAs for amplifying the received signal, etc. are packaged on one ceramic substrate. Reference numeral 200 indicates a high frequency power amplifying module (hereinafter called power module) including high frequency power amplifiers (hereinafter called power amps) 210a and 210b which drive an antenna ANT to perform transmission, an output power control circuit 230, etc.

Further, reference numeral 300 denotes a baseband circuit (hereinafter called baseband IC) brought into semiconductor integrated circuit form, which generates I and Q signals, based on transmit data (baseband signal) and processes I and Q signals extracted from the received signal. Reference numeral 400 indicates a front-end module including filters LPFs for removing noise such as higher harmonic waves contained in transmit signals outputted from the RF power module 200, transmit-receive selector switches, a duplexer, etc. Reference numeral 500 indicates a microprocessor (hereinafter called CPU) which generates control signals for the high frequency IC 110 and the baseband IC 300 and generates an output level designation signal Vramp for the power module 200 to thereby control the whole system.

The current detector 20, nth root converter 30 (or logarithm converter 30'), current-voltage converter 40 and error amplifier 50 shown in FIG. 5 are represented as the output power control circuit 230 in the form of one block in FIG. 8.

In the present embodiment as shown in FIG. 8, a power amp 210a for amplifying a transmit signal of 900 MHz corresponding to a GSM's frequency band, and a power amp 210b for amplifying a transmit signal of 1800 MHz corresponding to a DCS's frequency band are provided within the power module 200. Similarly, a SAW filter 120a and a low noise amp 130a for GSM, and a SAW filter 120b and a low noise amp 130b for DCS are provided within the RF module 100.

The high frequency IC 110 performs GMSK modulation for phase-modulating a carrier wave in accordance with information to be transmitted and inputs the phase-modulated signal to the power module 200 as a high frequency signal Pin, where it is amplified. In the present embodiment, although not restricted in particular, the high frequency IC 110 is configured so as to include a reception-system circuit comprising a mixer for down-converting the received signal to a signal low in frequency, a high-gain programmable gain amp, etc. in addition to a modulator for transmission. The low noise amps LNAs may be built in the high frequency IC 110.

The front-end module 400 is provided with a low-pass filter 410*a* for GSM, a low-pass filter 410*b* for DCS, a selector switch 420*a* for switching transmission/reception of GSM, a selector switch 420*b* for switching transmission/reception of DCS, a duplexer 430 connected to the antenna ANT and for separating a GSM signal and a DCS signal from a received signal, etc. Although not shown in FIG. 8, the power module 200 or the front-end module 400 is provided with impedance matching circuits connected between output terminals of the power amps 210*a* and 210*b* or transmit output terminals of the RF power module 200 and the low-pass filters 410*a* and 410*b* to perform impedance matching.

Incidentally, the maximum level of the output power of the power amp 210*a* on the GSM side and the maximum level of the output power of the power amp 210*b* on the DCS side are respectively provided or defined by the standards and different from each other in the above-described dual-band communication system for GSM and DCS. However, the size ratio between the high frequency power amplifying transistor TR3 and the output detecting transistor TR4 of the current detector 20 and the size ratio between the transistors TR5 and TR6 constituting the current mirror circuit are respectively suitably set to thereby make it possible to share the square root converter 30 or the logarithm converter 30', the current-voltage converter (sensing resistor) 40 and the error amplifier 50 between the two bands.

While the invention developed above by the present inventors has been described specifically based on the illustrated embodiments, the present invention is not limited to the embodiments. It is needless to say that many changes can be made thereto within the scope not departing from the substance thereof. Although the embodiment has explained the specific example of the square root converter as one example of the nth root converter 30, for example, the nth root converter 30 is not limited to the square root converter but may be a cubic root converter or a 4th root converter. However, ones up to the 4th root converter are enough for an actual system. Similarly, the logarithm converter 30' is not limited to the embodiment of FIG. 7 either. A known logarithm amplifier using the relationship between a base-to-emitter voltage and a collector current of a bipolar transistor may be utilized. Though the power amplifying FETs are connected in three stages in the high frequency power amplifier employed in the embodiment, they may be provided as a configuration of two stages or a configuration of four or more stages.

Further, though the embodiment has explained the example in which the nth root converter 30 or the logarithm converter 30' is provided between the current detector 20 and the current-voltage converter 40, the nth root converter 30 or the logarithm converter 30' may be configured so as to cause the current detector 20 or the current-voltage converter 40 to have such characteristics that its output changes on a nth root function basis or a logarithmic function basis with respect to the input. Also though the embodiment shows the nth root converter 30 and the logarithm converter 30' as examples of the current converters for converting the currents detected by the current detectors 20, the current converters are not limited to them. A current converter may be adopted which converts the output current of the current detector 20 into such a current as represented by a function which has no local maximum and monotonously increases in an upward convex form.

While the above description has principally been made of the case in which the invention made by the present inventors is applied to the power module constituting the dual mode type wireless communication system capable of performing transmission and reception by the two communication systems of GSM and DCS, which belong to the field of application corresponding to the background of the invention, the present invention is not limited to it. The present invention can be applied to a power module constituting a wireless communication system such as a multi mode type cellular phone or mobile phone or the like capable of transmission and reception by three or more communication systems such as the GMS, DCS, PCS (Personal Communication System), etc.

An advantageous effect obtained by a representative one of the inventions disclosed in the present application will be described in brief as follows:

According to the present invention, the control sensitivity of a high frequency power amplifier with respect to an output level designation signal in an area low in transmit request level is reduced, so that an output level can be controlled with satisfactory accuracy over the whole control range. It is also possible to realize a high-reliable high frequency power amplifier which remains unchanged in control sensitivity even if the temperature changes, and a wireless communication system using the same.

What is claimed is:

1. A power amplifier circuit for use in a wireless communication system, the power amplifier circuit comprising:
   a power amplifier coupled to receive an input signal and amplifying the input signal to provide an output signal;
   a first converter coupled to receive the output signal of the power amplifier and providing a first signal which follows a power of the output signal;
   a non-linear converter coupled to receive the first signal and providing a second signal;
   a second converter coupled to receive the second signal and providing a voltage based on the second signal;
   an error amplifier coupled to both the voltage and an output level designation signal and providing a third signal corresponding to a difference therebetween; and
   a bias circuit coupled to receive the third signal and providing to the power amplifier a bias in accordance with the third signal,
   wherein the non-linear converter is an nth root converter converting the first signal into the second signal obtained by extracting the nth (where n is a positive integer) root of the first signal.

2. A power amplifier circuit according to claim 1, wherein the nth root converter is a square root converter.

3. A power amplifier circuit according to claim 2, wherein the square root converter is a circuit including field effect transistors and which receives the first signal and a reference current as input signals and outputs a current obtained by extracting the square root of the product of both the first signal and the reference current.

4. A power amplifier circuit for use in a wireless communication system, the power amplifier circuit comprising:
   a power amplifier coupled to receive an input signal and amplifying the input signal to provide an output signal;
   a first converter coupled to receive the output signal of the power amplifier and providing a first signal which follows a power of the output signal;
   a non-linear converter coupled to receive the first signal and providing a second signal;

a second converter coupled to receive the second signal and providing a voltage based on the second signal;

an error amplifier coupled to both the voltage and an output level designation signal and providing a third signal corresponding to a difference therebetween; and a bias circuit coupled to receive the third signal and providing to the power amplifier a bias in accordance with the third signal, wherein the non-linear converter is a logarithm converter converting the first signal into the second signal obtained by log-transforming the first signal and outputs it therefrom, wherein the logarithm converter includes:

a pair of diodes which receive the first signal and a reference current as input signals and cause the first signal and the reference current to flow therethrough respectively, differential amplifiers which receive voltages converted by the diodes as inputs and output voltages each corresponding to the difference between the voltages, and a temperature compensating device which compensates for temperature characteristics of the diodes, and outputs a temperature dependence-free voltage.

5. A power amplifier circuit according to claim 4, wherein the logarithm converter includes a first-stage circuit having bipolar transistors.

6. A power amplifier circuit for use in a wireless communication system, the power amplifier circuit comprising:

a power amplifier coupled to receive an input signal and amplifying the input signal to provide an output signal;

a first converter coupled to receive the output signal of the power amplifier and providing a first signal which follows a power of the output signal;

a non-linear converter coupled to receive the first signal and providing a second signal;

a second converter coupled to receive the second signal and providing a voltage based on the second signal;

an error amplifier coupled to both the voltage and an output level designation signal and providing a third signal corresponding to a difference therebetween; and a bias circuit coupled to receive the third signal and providing to the power amplifier a bias in accordance with the third signal, wherein the first converter comprises: an output detecting transistor, and a current mirror circuit which includes a first transistor coupled in series with the output detecting transistor and a second transistor whose control terminal is mutually coupled in common to a control terminal of the first transistor, and wherein the non-linear converter receives an output of the current mirror circuit as said first signal and outputs the second signal.

* * * * *